United States Patent [19]

Mori et al.

[11] Patent Number: 5,367,179
[45] Date of Patent: Nov. 22, 1994

[54] THIN-FILM TRANSISTOR HAVING ELECTRODES MADE OF ALUMINUM, AND AN ACTIVE MATRIX PANEL USING SAME

[75] Inventors: Hisatoshi Mori, Hachioji; Syunichi Sato, Kawagoe; Naohiro Konya, Hino; Ichiro Ohno, Hachioji; Hiromitsu Ishii, Tokorozawa; Kunihiro Matsuda, Sagamihara; Junji Shiota, Tachikawa, all of Japan

[73] Assignee: Casio Computer Co., Ltd., Tokyo, Japan

[21] Appl. No.: 975,282

[22] Filed: Nov. 12, 1992

Related U.S. Application Data

[63] Continuation-in-part of Ser. No. 762,937, Sep. 19, 1991, abandoned, which is a continuation-in-part of Ser. No. 690,816, Apr. 23, 1991, Pat. No. 5,284,789.

[30] Foreign Application Priority Data

| Apr. 25, 1990 | [JP] | Japan | 2-107376 |
| Apr. 25, 1990 | [JP] | Japan | 2-107377 |
| Sep. 7, 1990 | [JP] | Japan | 2-235675 |
| Sep. 12, 1990 | [JP] | Japan | 2-239940 |
| Sep. 12, 1990 | [JP] | Japan | 2-239941 |
| Sep. 14, 1990 | [JP] | Japan | 2-242576 |
| Sep. 14, 1990 | [JP] | Japan | 2-242577 |
| Sep. 21, 1990 | [JP] | Japan | 2-250381 |
| Sep. 21, 1990 | [JP] | Japan | 2-250383 |
| Mar. 28, 1991 | [JP] | Japan | 3-87248 |
| Nov. 15, 1991 | [JP] | Japan | 3-326773 |
| Nov. 15, 1991 | [JP] | Japan | 3-326774 |
| Nov. 15, 1991 | [JP] | Japan | 3-326775 |
| Nov. 15, 1991 | [JP] | Japan | 3-326777 |
| Dec. 24, 1991 | [JP] | Japan | 3-355633 |

[51] Int. Cl.$^5$ .................................... H01L 23/48
[52] U.S. Cl. ........................ 257/59; 257/770; 257/771; 359/87
[58] Field of Search ............ 257/770, 771, 60, 764, 257/765, 57, 59; 359/87

[56] References Cited

U.S. PATENT DOCUMENTS

| 3,853,496 | 12/1974 | Kim. | |
| 4,020,222 | 4/1977 | Kausche et al. | 428/209 |
| 4,302,498 | 11/1981 | Faith, Jr. | 428/209 |
| 4,834,942 | 5/1989 | Frazier et al. | 420/552 |
| 4,937,652 | 6/1990 | Okumura et al. | 257/754 |
| 4,977,440 | 12/1990 | Stevens | 257/753 |
| 5,018,001 | 5/1991 | Kondo et al. | 257/771 |
| 5,057,889 | 10/1991 | Yamada et al. | |
| 5,076,666 | 12/1991 | Katayama et al. | |
| 5,124,779 | 6/1992 | Furukawa et al. | 257/77 |
| 5,148,259 | 9/1992 | Kato et al. | 257/771 |
| 5,150,233 | 9/1992 | Enomoto et al. | 359/54 |
| 5,152,960 | 10/1992 | Yuki et al. | 420/418 |
| 5,227,231 | 7/1993 | Yoshizaki et al. | 428/336 |
| 5,231,306 | 7/1993 | Meikle et al. | 257/751 |
| 5,243,202 | 9/1993 | Mori et al. | 257/60 |

FOREIGN PATENT DOCUMENTS 0301571 2/1989 European Pat. Off. .

(List continued on next page.)

OTHER PUBLICATIONS

Thin Solid Films, vol. 168, No. 2, Jan. 15, 1989, pp. 281-289; C.-S. Yoo et al, "Factural experimental investigation of plasma-enhanced chemical vapor deposition of silicon nitride thin films".

(List continued on next page.)

Primary Examiner—Andrew J. James
Assistant Examiner—Courtney A. Bowers
Attorney, Agent, or Firm—Frishauf, Holtz, Goodman & Woodward

[57] ABSTRACT

A thin-film transistor comprises a gate electrode formed on an insulating substrate, a gate insulating film covering the gate electrode and the insulating substrate, an i-type semiconductor layer formed on the gate insulating film, and a source electrode and a drain electrode electrically connected to two ends of the i-type semiconductor layer, respectively. The gate electrode is made of aluminum alloy containing high-melting-point metal such as Ti and Ta and oxygen or nitrogen or both.

19 Claims, 5 Drawing Sheets

FOREIGN PATENT DOCUMENTS

| | | |
|---|---|---|
| 0342796 | 11/1989 | European Pat. Off. . |
| 55-138257 | 10/1980 | Japan . |
| 61-183433 | 8/1986 | Japan . |
| 61-1185723 | 8/1986 | Japan . |
| 63-161669 | 7/1988 | Japan ................................. 257/771 |
| 63-221669 | 9/1988 | Japan . |
| 63-229856 | 9/1988 | Japan . |

OTHER PUBLICATIONS

Solid State Technology, vol. 28, No. 6, Jul. 1985, pp. 197–203; B. Gorowitz et al., "Applications of Plasma Enhanced Chemical Vapor Deposition in VLSI".

Solid State Technology, vol. 23, No. 4, Apr. 1980, pp. 133–136, A. K. Sinha, "Plasma Deposited Polycrystalline Silicon Films".

Solid State Technology, vol. 23, No. 4, Apr. 1980, pp. 137–142, K. M. Mar et al, "Properties of Plasma Enhancement CVD Silicon Nitride: Measurements and Interpretations".

Journal Of The Electrochemical Society, vol. 124, Apr. 1978, pp. 601–608, A. K. Sinha et al, "Reactive Plasma Deposited Si–N Films for MOS-LSI Passivation".

Journal Of Vacuum Science And Technology: Part B, vol. 6, No. 2 pp. 517–523, J. Dresner, "Plasma deposition of SiO2 gate insulators for a–Si thin-film transistors", Mar./Apr. 1988.

Thin Solid Films, vol. 147, No. 3, Mar. 1987, pp. 259–266, D. J. Eagle, et al "Production of silicon oxides from the glow discharge decomposition of silane and NO2".

THIN-FILM TRANSISTOR HAVING ELECTRODES MADE OF ALUMINUM, AND AN ACTIVE MATRIX PANEL USING SAME

CROSS-REFERENCE TO THE RELATED APPLICATION

This is a continuation-in-part of U.S. Ser. No. 762,937, filed on Sep. 19, 1991, abandoned, which in turn is a continuation-in-part application of U.S. Ser. No. 690,816, filed Apr. 23, 1991, now U.S. Pat. No. 5,284,789, issued Feb. 8, 1994.

BACKGROUND OF THE INVENTION

1. Field of the Invention

The present invention relates to a thin-film device comprising an insulating substrate, an insulating film, at least two conductive layers sandwiching the insulating film, said insulating film and said conductive layers being formed on the substrate, one upon another.

2. Description of the Related Art

A thin-film device comprises an insulating substrate, a lower conductive layer formed on the substrate, a thin insulating film covering the lower conductive layer, and an upper conductive layers formed on the insulating film.

The thin-film device is used as multi-layer wiring substrates, thin-film diodes and thin-film transistors.

In most cases, the upper and lower conductive layers (wirings) of the thin-film device are made of metal such as chromium (Cr), tantalum (Ta), molybdenum (Mo), or the like, and the thin insulating film of the device is made of silicon nitride (SiN) or the like. When the thin-film device is manufactured in the form of a thin-film transistor, it has a semiconductor layer of amorphous silicon (a-Si).

A conventional multi-layer wiring board having layers made of a high-melting-point metal such as Cr, Ta, Mo or the like has two problems. First, its manufacturing cost is high since Cr, Ta, Mo or the like is expensive. Second, since the high melting point metal layers have high resistance, the voltage drop in the metal layers is so great as to deteriorate the operating characteristics of semiconductor elements or the like connected to the metal layers.

To solve these problems, it has been proposed that the conductive layer of a multi-layer wiring board be made of aluminum (Al) since aluminum is inexpensive and has a low electrical resistivity. If the conductive layer is made of aluminum, the following problem will arise.

A multi-layer wiring board is manufactured in the following steps. First, a lower conductive layer is formed on an insulating substrate (e.g., a glass substrate). Then, an insulating film is formed on the lower conductive layer. Next, an upper conductive layer is finally formed on the insulating film. The insulating film is formed by a plasma CVD apparatus at a film-forming temperature of hundreds of degrees centigrade. If the lower conductive layer is made of aluminum, it will have hillocks on its surface during the forming of the insulating film. The hillocks protrude into the insulating film, forming defects, e.g., cracks, in the insulating film. Due to the defects, the lower conductive layer will be short-circuited to the upper conductive layer.

Assume the thin-film device described above is used as a thin-film transistor of reverse stagger type. The thin-film transistor is manufactured in the following way. First, a gate electrode (i.e., a lower electrode) is formed on an insulating substrate (e.g., a glass substrate). Next, a gate insulating film is formed on the substrate and the gate electrode. Then, a semiconductor layer is formed on the gate insulating film. Further, a source electrode and a drain electrode (i.e., upper electrodes) are formed on the semiconductor layer. The gate insulating film and the semiconductor layer are formed by a plasma CVD apparatus at a film-forming temperature of hundreds of degrees centigrade. Hence, if the gate electrode is made of aluminum, it will have hillocks on its surface during the forming of the gate insulating film and/or the semiconductor layer. The hillocks protrude into the gate insulating film, forming defects in the gate insulating film. Due to the defects, the gate electrode will be short-circuited to the source and drain electrodes.

In other types of thin-film devices such as a stagger type thin-film transistor, a coplanar type thin-film transistor, a reverse coplanar type thin-film transistor and a thin-film diode, the lower conductive layer, if made of aluminum, will also have hillocks on its surface during the forming of an insulating film, forming defects in the insulating film.

It has been pointed out that an aluminum layer will not have hillocks even if heated to hundreds of degrees centigrade, provided that it contains a small amount of high-melting-point metal (e.g., Ti or Ta). Thus, if the lower conductive layer of a thin-film device is made of aluminum containing a high-melting-point metal, it will have no hillocks on its surface during the forming of an insulating film.

The inventors hereof made a multi-layer wiring board having a lower conductive layer of aluminum containing a high-melting metal. The lower conductive layer and upper conductive layer of this board were short-circuited to each other. To determine why so, the inventors conducted the following experiment.

Figure 6:
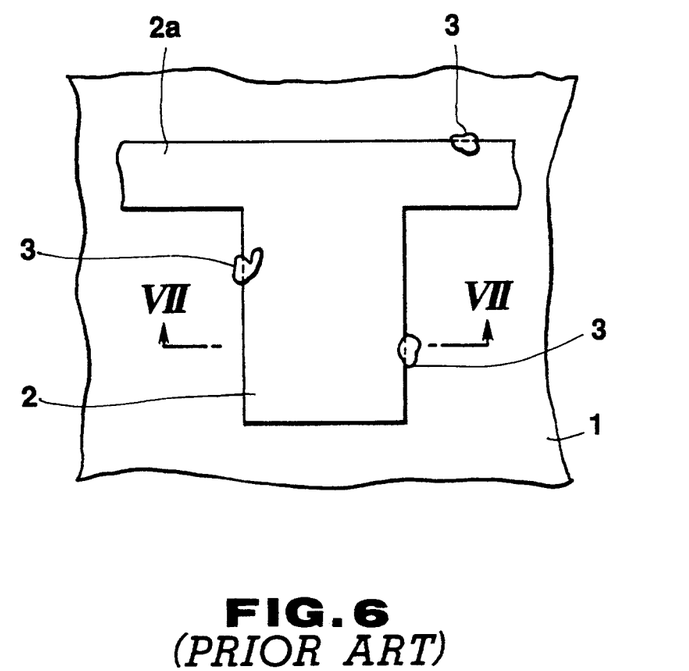
FIG. 6 is a plan view of a conductive layer which has been heat-treated by the conventional method.
Figure 7:
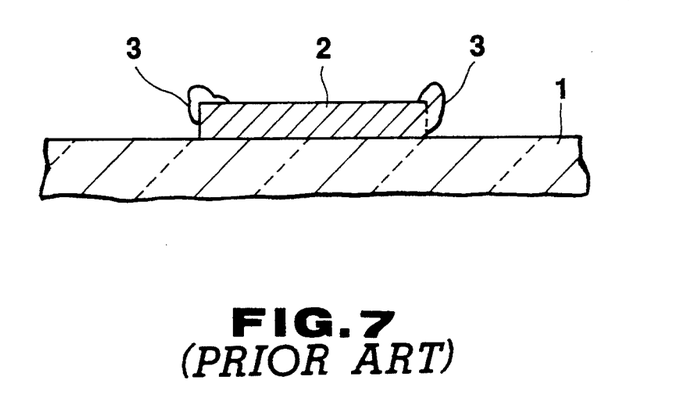
FIG. 7 is a cross-sectional view of the conductive layer, taken along line VII—VII in FIG. 6.

First, they formed a conductive layer 2 made of Ti-containing aluminum, on a glass substrate 1, as is shown in FIGS. 6 and 7. Next, they heated the glass substrate 1 to about 250° C. and examined the surface condition of the conductive layer 2. No hillocks were formed on the surface of the layer 2, but projections 3 were formed, extending from the sides and edges of the conductive layer 2. The projections 3 were formed, probably because crystal grew locally in the sides and edges of the layer 2 during the layer 2 was heated gradually.

A multi-layer wiring board is manufactured by the method described above. When an insulating film is formed on the lower conductive layer, the lower conductive layer is inevitably heated to the temperature at which the insulating film is formed. Hence, projection will be formed, extending from the sides and edges of the lower conductive layer, during the forming of the insulating film, even if the lower conductive layer is made of aluminum containing a high-melting-point metal. The projections protrude into the insulating film, forming defects, such as cracks, in the insulating film. Due to these defects, the lower conductive layer is short-circuited to the upper conductive layer which is subsequently formed on the insulating film.

SUMMARY OF THE INVENTION

The object of this invention is to provide a thin-film device which comprises a lower conductive layer made of aluminum, an insulating film formed on the lower conductive layer, and an upper conductive layer formed on the insulating film, and in which the lower conducive layer has neither hillocks nor projections, though it is made of aluminum, i.e., an inexpensive, low-melting-point metal has been heated to high temperature during the forming of the insulating film, and no defects are formed in the insulating film, thus preventing short-circuiting between the the lower and upper conductive layers.

To achieve the object, a thin-film device according to this invention comprises an insulating substrate, an insulating film, at least two conductive layers sandwiching the insulating film, said insulating film and said conductive layers being formed on the substrate, one upon another, and is characterized in that at least the lower conductive layer is made of an aluminum alloy containing high-melting-point metal and about 4 at % (atomic percent) or more of oxygen and/or nitrogen.

The oxygen and/or nitrogen, contained in said amount in the aluminum alloy, inhibit abnormal growth of aluminum crystal, and no projections protrude from the edges of the conductive layer.

It is desirable that oxygen and/or nitrogen be contained in the aluminum alloy in an amount small enough not to noticeably increase the electrical conductivity of the aluminum alloy. Preferably, the high-melting-point metal contains titanium or tantalum, or both. The content of titanium and/or tantalum is selected in accordance with the temperature at which to heat-treat the thin-film device. It is preferably about 4 wt % (weight percent) or more if the heat treatment temperature is 250° C. The higher the temperature, the higher the content of titanium and/or tantalum.

The most desirable for the material of the conductive layer is an aluminum alloy which contains titanium used as high-melting-point metal and about 4 at % or more of oxygen, preferably not exceeding 10 at %.

The present invention can be used applied to a thin-film transistor. In this case, of the gate electrode, the source electrode and the drain electrode, at least the electrode (i.e., conductive layer) which is located near the insulating substrate is made of the aluminum alloy specified above. No projections protrude from the edges of the electrode located near the substrate even if the electrode is exposed in an atmosphere of a relative high temperature. Hence, the gate electrode and the source electrode are not short-circuited to each other, nor are the gate electrode and the drain electrode short-circuited to each other.

The present invention can also applied to a thin-film transistor panel comprising a insulating substrate and thin-film transistors arranged in rows and columns on the insulating substrate. In this case, of the scan lines each connecting the gate electrodes of the transistors of the same row and the data lines each connecting the drain electrodes of the transistors of the same column, at least those located near the insulating substrate are made of the aluminum alloy specified above. Since the aluminum alloy contains a high-melting metal and oxygen and/or nitrogen, no projections protrude from the edges of each scan line and/or each data line. Hence, no short-circuiting occur between any scan line and any data line. The gate electrodes of the thin-film transistors of each row may be formed integral with the associated scan line, and the drain electrodes of the thin-film transistors of each column may be formed integral with the associated data line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the invention will be described, with reference to FIGS. 1 to 5. This embodiment is a thin-film device for use in a TFT active matrix liquid-crystal display.

Figure 3:
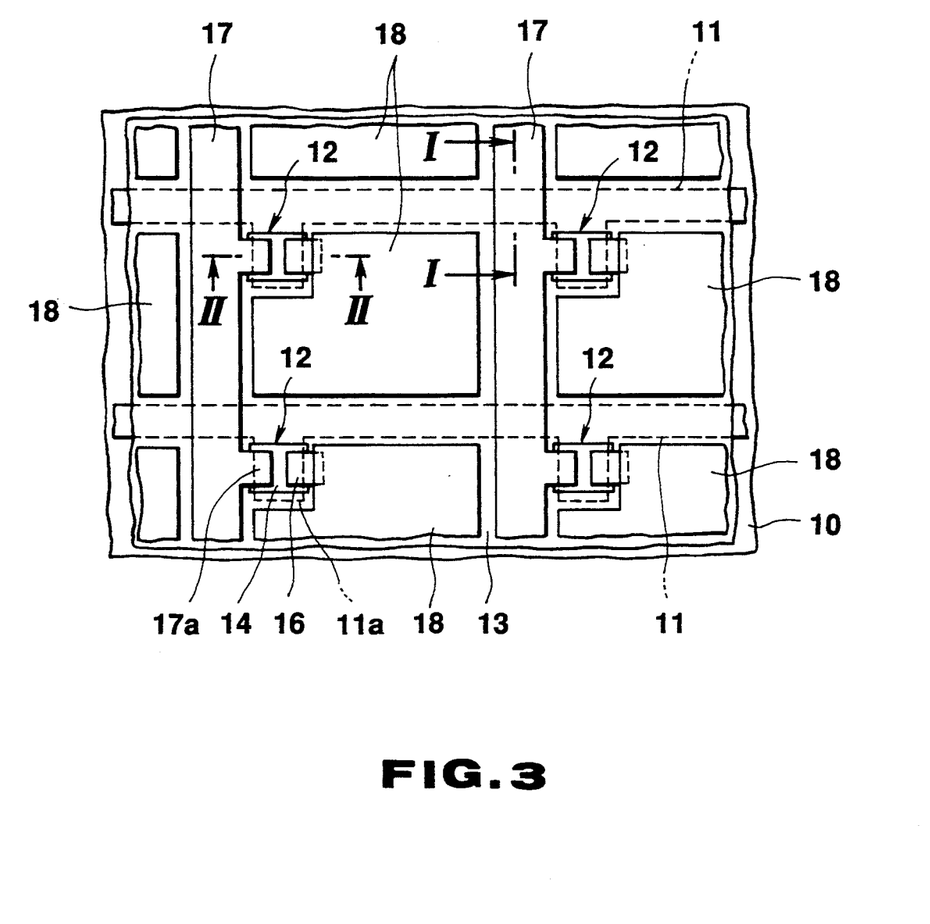
FIG. 3 is a plan view of part of a thin-film transistor panel comprising a plurality of thin-film transistors identical to the one shown in FIGS. 1 and 2.

The TFT active matrix liquid-crystal display has a thin-film transistor (TFT) panel which is a multi-layer wiring board. As is shown in FIG. 3, the TFT panel comprises a transparent insulating substrate 10 made of glass or the like, a plurality of scan lines 11 formed on the substrate 10 and extending parallel to one another, a plurality of data lines 17 extending at right angles to the scan lines 11, a plurality of, for example, thin-film transistors (TFTs) 12 (i.e., active elements), and a plurality of pixel electrodes 18 connected to the thin-film transistors 12. The transistors 12 are of reverse stagger type, formed on the substrate 10 and located at the intersections of the scan lines 11 and the data lines 17, respectively.

Figure 1:
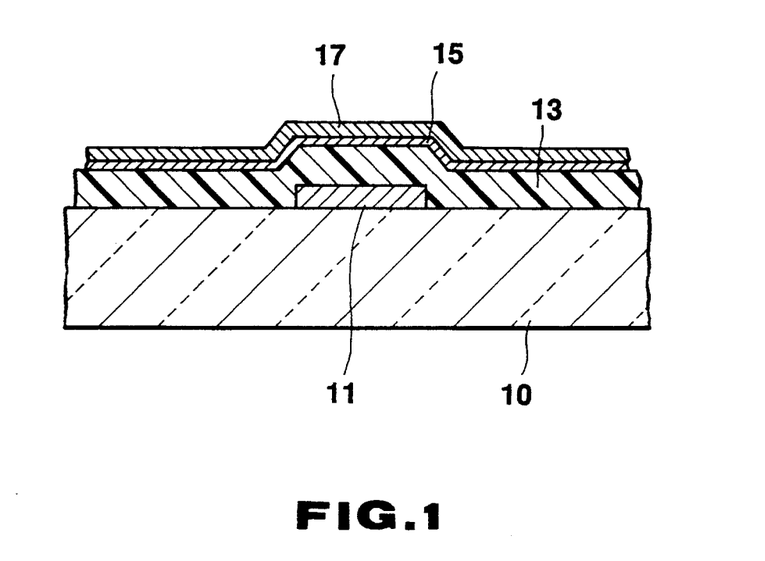
FIG. 1 is a cross-sectional view of a thin-film device according to one embodiment of the invention, taken along line I—I in FIG. 3.
Figure 2:
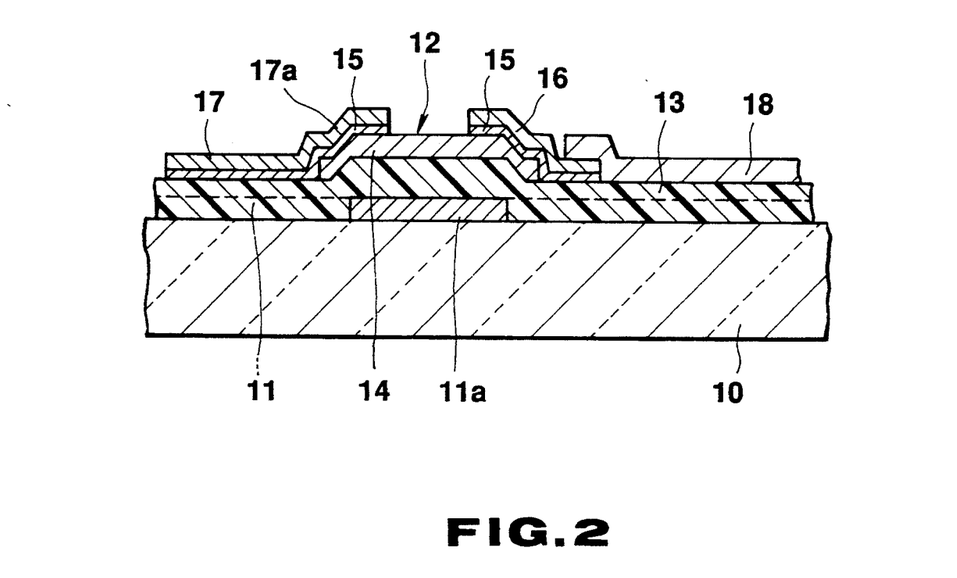
FIG. 2 is a cross-sectional view of the thin-film transistor according to the invention, taken along line II—II in FIG. 3.

As is shown in FIG. 2, each of the reverse stagger type thin-film transistors 12 comprises a gate electrode 11a, a gate insulating film 13 made of SiN and formed on the gate electrode 11a, an i-type semiconductor layer 14 made of a-Si (amorphous silicon), formed on the film 13 and located above the a gate electrode 11a, an n-type semiconductor layer 15 made of a-Si doped with n-type impurity and formed on the i-type semiconductor layer 14, and a source electrode 16 and a drain electrode 17a, both formed on the n-type semiconductor layer 15 and located above the opposing end portions of the i-type semiconductor layer 14.

The gate electrode 11a of the thin-film transistor 12 is formed on the substrate 10 and integral with one of the scan lines 11 which are formed on the substrate 10, too.

The gate insulating film 13 covers almost the entire surface of the substrate 10 and, therefore, covers the scan lines 11. The end portions of each scan line 11 are exposed through openings made in the gate insulating film 13. The drain electrode 17a of the thin-film transistor 12 is integral with one of the data lines 17 which are formed on the gate insulating film 13.

As can be best seen from FIG. 2, the scan lines 11 are the lower layers of the TFT panel (i.e., a multi-layer wiring board), and the data lines 17 are the upper layers of the TFT panel. The scan lines 11 are electrically insulated from the data lines 17 by the gate insulating film 13.

The pixel electrode 18 is made of transparent conductive material such as ITO. As is shown in FIG. 2, the electrode 18 is formed on the gate insulating film 13. It has its one end located on the source electrode 16 of the thin-film transistor 12 and is, thus, connected to the source electrode 16.

The TFT panel is manufactured in the following method.

First, a lower metal layer is formed on the substrate 10 by means of a sputtering apparatus. The metal layer is patterned, forming the scan lines 11 and gate electrodes 11a. Next, the gate insulating film 13 is formed on the substrate 10, the scan lines 11, and the gate electrodes 11a, by means of a plasma CVD apparatus. The i-type semiconductor layer 14 is formed on the gate insulating film 13, also by the plasma CVD apparatus. Then, the n-type semiconductor layer 15 is formed on the i-type semiconductor layer 14 by the plasma CVD apparatus. The n-type semiconductor layer 15 and the i-type semiconductor layer 14 are patterned, forming two-layer units having the size of the thin-film transistor 12. It should be noted that the temperature at which to form the gate insulating film 13 (i.e., an SiN film) is about 350° C. in most cases, but the film 13 can have a sufficiently high withstand voltage if formed slowly at a relatively low temperature of about 250° C., at a low RF discharging power density.

Thereafter, the upper metal layer is formed by means of the sputtering apparatus. The upper metal layer Is patterned, forming the source electrodes 16, the data liens 17, and drain electrodes 17a. Those portions of the n-type semiconductor layer 15, each exposed through the gap between the source electrode 16 and the drain electrode 17a, are etched away, thereby exposing the i-type semiconductor layer 14. As a result, the thin-film transistors 12 are fabricated.

Next, a transparent conductive layer, such as an ITO layer, is formed on the entire surface of the unfinished product, by means of the sputtering apparatus. This conductive layer is patterned, forming the pixel electrodes 18. Thus manufactured is the TFT panel.

The scan lines 11 of the TFT panel and the gate electrodes 11a formed integral with the scan lines 11 will now be described in greater detail.

The scan lines 11 and the gate electrodes 11a should better be made of aluminum which is an inexpensive metal having a low electrical resistivity. If the scan lines 11 and the gate electrodes 11a are made of pure aluminum, however, they will have hillocks on their surfaces when the gate insulating film 13, the i-type semiconductor layer 14, and/or the n-type semiconductor layer 15 is formed. If they are made of an aluminum alloy containing a high-melting-point metal such as Ti, they will have no hillocks but will have projections 6, as is shown in FIGS. 6 and 7, when the gate insulating film 13, the i-type semiconductor layer 14, and/or the n-type semiconductor layer 15 is formed.

In this invention, the scan lines 11 and the gate electrodes 11a are made of aluminum containing a high-melting-point metal and oxygen and/or nitrogen, which will hereinafter be referred to as "Ti, oxygen/nitrogen-containing Al."

The content of Ti in the Ti, oxygen/nitrogen-containing Al is of such a value that the scan lines 11 and the gate electrodes 11a will have no hillocks when the gate insulating film 13, the semiconductor layer 14, and/or the semiconductor layer 15 is formed.

As indicated above, the gate insulating film 13 can be formed at a film-forming temperature of about 350° C. or at a relatively low film-forming temperature of about 250° C. The 1-type semiconductor layer 14 and the n-type semiconductor layer 15 are formed at about 250° C., and the upper metal layer and the pixel electrodes 18 are formed at about 100° C.

The highest of these temperatures is about 350° C. at which the gate insulating film 13 is formed. Another point to consider is that the film 13 can be formed at about 250° C. Thus, if the film 13 is formed at about 350° C., it suffices to set the Ti content of the Ti, oxygen/nitrogen-containing Al at such a value that the scan lines 11 and the gate electrodes 11a will have no hillocks when heated to about 350° C. Alternatively, if the film 13 is formed at about 250° C., it suffices to set the Ti content of the Ti, oxygen/nitrogen-containing Al at such a value that the scan lines 11 and the gate electrodes 11a will have no hillocks when heated to about 250° C.

More specifically, it suffices to set the Ti content at 4.2 wt % or more if the gate insulating film 13 is formed at about 350° C., and at 2.2 wt % or more if the gate insulating film 13 is formed at about 250° C. If the scan lines 11 and the gate electrodes 11a are made of aluminum having such a Ti content, they will have no hillocks on their surfaces during the manufacture of the TFT panel.

It is difficult to control the Ti content accurately. In view of this, it would be desirable that the Ti content be a little greater than the value specified above (i.e., 4.2 wt % or 2.2 wt %). If the Ti content is too great, however, the lines 11 and the electrodes 11a will have excessively high resistances.

Hence, in the present invention, the Ti content of the Ti, oxygen/nitrogen-containing Al is set at about 7 wt % if the gate insulating film 13 is formed at about 350° C., and at about 5 wt % if the film 13 is formed at about 250° C.

The oxygen and/or nitrogen content of the Ti, oxygen/nitrogen-containing Al is set at about 4 at % or more, no matter whether the gate insulating film 13 is formed at about 350° C. or about 250° C. If the oxygen and/or nitrogen content is less than about 4 at %, the scan lines 11 and the gate electrodes 11a will have such projections as are shown in FIGS. 6 and 7, when the gate insulating film 13, the semiconductor layer 14, or the semiconductor layer 15 is formed. If the oxygen and/or nitrogen content is too high, for example, exceeding about 10 at %, the Ti, oxygen and/or nitrogen-containing Al will likely become similar to an oxide or a nitride and will have an excessively high resistivity.

The layer of the Ti, oxygen/nitrogen-containing Al (i.e., the lower conductive layer) can be formed by a sputtering apparatus, using a target made of aluminum containing a proper amount of titanium and an appropriate amount of oxygen and/or nitrogen. The temperature at which to form the layer of the Ti, oxygen/nitrogen-containing Al is approximately 100° C.

The scan lines 11 and the gate electrodes 11a integral with the lines 11 of the TFT panel, which have been formed by patterning the lower conductive layer, are made of the Ti, oxygen/nitrogen-containing Al having a Ti content of about 7 wt % or about 5 wt % and an oxygen and/or nitrogen content of about 4 at % or more. Hence, the scan lines 11 and the gate electrodes 11a will have no hillocks or projections when they are heated while the gate insulating film 13, the i-type semiconductor layer 14, or the n-type semiconductor layer 15 is being formed, as was probed by the results of the following experiment the inventors conducted.

In the experiment, a plurality of electrodes made of various Ti, oxygen/nitrogen-containing Al having the same Tl content of about 5 wt % and different oxygen and/or nitrogen contents of 2.4 at %, 4.0 at % and 4.6 at % was formed on a glass substrate. The substrate was heated to 250° C., and the surface conditions of the electrodes were examined. The electrodes made of the Ti, oxygen/nitrogen-containing Al having an oxygen and/or nitrogen content of 2.4 at % had no hillocks but had projections extending from the sides or edges. In contrast, the electrodes made of the Ti, oxygen/nitrogen-containing Al having an oxygen and/or nitrogen contents of 4.0 at % and 4.6 at % had neither hillocks nor projections; they had smooth surfaces.

Since neither hillocks nor projections are formed on the scan lines 11 or the gate electrodes 11a during the forming of the gate insulating film 13 or the like, the gate insulating film 13 has no defects. Hence, the scan lines 11 (i.e., the lower conductive layers) are not short-circuited to the data lines 17 (i.e., the upper conductive layers), and gate electrodes 11a are not short-circuited to the source electrodes 16 or the drain electrodes 17a.

The data lines 17, the drain electrodes 17a, and the source electrodes 16, all incorporated in the TFT panel, can be made of metal such as aluminum containing only Ti or Ta. Nonetheless, they should better be made of the Ti, oxygen/nitrogen-containing Al specified above. If they are made of this specific material, they will have neither hillocks nor projections when a protective insulating film (not shown) of SiN or the like is formed, and no defects such as cracks will be formed in the protective insulating film. Further, if the drain electrodes 17a and the source electrodes 16 are made of the Ti, oxygen/nitrogen-containing Al, they will have their surfaces not roughened at all, and thus remain in firm bonding with the n-type semiconductor layer 15. As a result, the ohmic contact between the electrodes 16 and 17a, on the one hand, and the n-type semiconductor layer 15, on the other, is secured.

In the embodiment described above, Ti is used as high-melting metal to be contained in aluminum. Ti can be replaced by Ta or the like. Further, the aluminum may contain hydrogen as well. The gate insulating film 13 made of SiN can be replaced by a two-layer film consisting of a SiN film and an oxide film (e.g., a silicon oxide film, a tantalum oxide film, an aluminum oxide film, or the like).

Moreover, the reverse stagger thin-film transistors 12, used as active elements, can be replaced by reverse coplanar thin-film transistors, stagger thin-film transistors or coplanar thin-film transistors, or by thin-film diodes. If the active elements 12 are stagger thin-film transistors or coplanar thin-film transistors, the data lines 17 will be upper conductive layers, and the scan lines 11 will be lower conductive layers.

The TFT panel described above is designed for use in TFT active matrix liquid-crystal displays. Needless to say, the present invention can apply to any multi-layer wiring board that is similar to the TFT panel and that comprises thin-film devices.

A second embodiment of the invention, i.e., a thin-film transistor different in structure from the transistors 12, will now be described with reference to FIG. 4.

Figure 4:
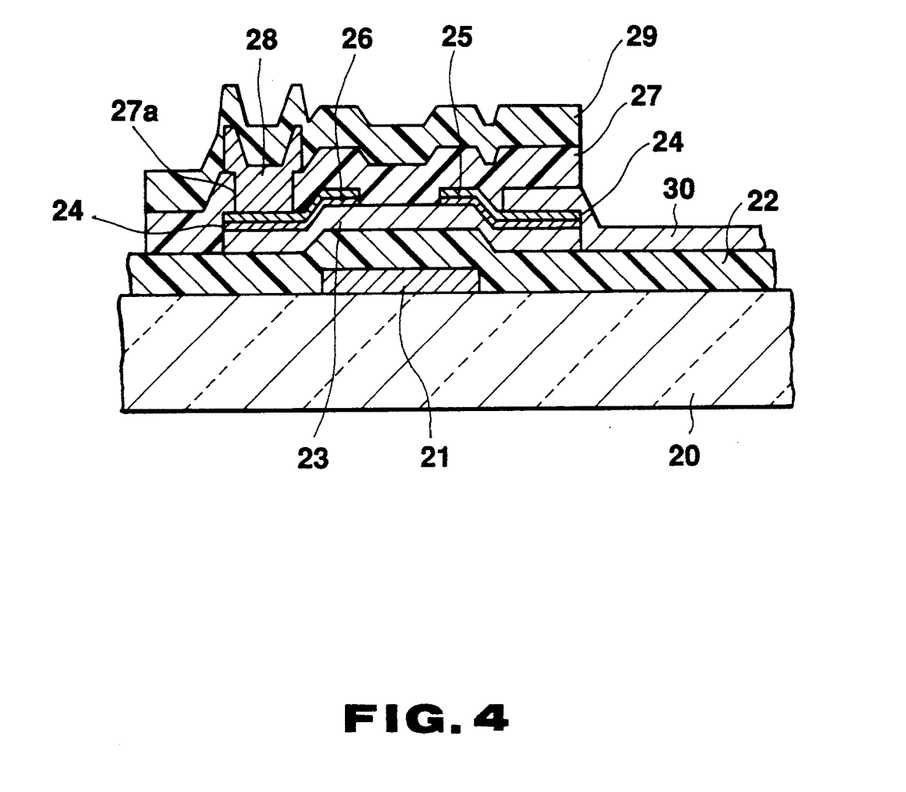
FIG. 4 is a cross-sectional view of a thin-film transistor of another type according to the invention.

As is evident from FIG. 4, this thin-film transistor comprises a gate electrode 21 formed on a substrate 10, a gate insulating film 22 made of SiN and formed on the substrate 20 and the gate electrode 21, an i-type semiconductor layer 23 made of a-Si, formed on the gate insulating film 22 and located above the gate electrode 21, an n-type semiconductor layer 24 made of a-Si doped with n-type impurity and formed on the i-type semiconductor layer 23, and a source electrode 25 and a drain electrode 26, both formed on the n-type semiconductor layer 24 and located above the opposing end portions of the i-type semiconductor layer 23.

The gate electrode 21 is integral with a scan line (not shown). The scan line is formed on the substrate 20, covered with the gate insulating film 22.

The gate insulating film 22 covers the entire surface of the substrate 20, but the scan line integral with the gate electrode 21. A pixel electrode 30 made of transparent conductive material such as ITO is formed on the gate insulating film 22 which is also transparent. The pixel electrode 30 has its one end portion overlapping the source electrode 25, and is therefore electrically connected to the source electrode 25.

The thin-film transistor is covered with an interlayer insulating film 27 made of SiN. A data line 28 is formed on the interlayer insulating film 27 and in the contact hole 27a made in the film 27. Hence, the data line 28 is connected to the drain electrode 26. A protective insulating film 29 made of SiN is formed on the thin-film transistor and the data line 28.

The thin-film transistor is manufactured by the following method.

First, a metal layer is formed on the substrate 20 by means of a sputtering apparatus. The metal layer is patterned, forming the gate electrodes 21 and also the scan lines integral with the electrodes 21. Next, the gate insulating film 22 is formed on the substrate 20, the scan lines, and the gate electrodes 21, by means of a plasma CVD apparatus. The i-type semiconductor layer 23 is formed on the gate insulating film 22, also by the plasma CVD apparatus. Then, the n-type semiconductor layer 24 is formed on the i-type semiconductor layer 23 by the plasma CVD apparatus. The n-type semiconductor layer 24 and the i-type semiconductor layer 23 are patterned, forming two-layer units having the size of the thin-film transistor. It should be noted that the temperature at which to form the gate insulating film 22 (i.e., an SiN film) is about 350° C. in most cases, but the film 22 can have a sufficiently high withstand voltage if formed slowly at a relatively low temperature of about 250° C., at a low RF discharging power density.

Thereafter, another metal layer is formed by means of the sputtering apparatus. This metal layer is patterned, forming the source electrodes 25, the drain electrodes 26, and the data lines integral with the electrodes 26. That portion of the n-type semiconductor layer 24 which is exposed through the gap between the source electrode 25 and the drain electrode 26, is etched away, thereby exposing the i-type semiconductor layer 24. As a result, the thin-film transistor is fabricated. Both the source electrode 25 and the drain electrode 26 are made of metal, such as Cr., which can readily form an ohmic contact with the n-type semiconductor layer 24.

Next, a transparent conductive layer, such as an ITO layer, is formed on the entire surface of the thin-film transistor by means of the sputtering apparatus. This conductive layer is patterned, forming the pixel electrodes 30. An SiN film is formed by the plasma CVD apparatus, and is subsequently pattern, forming the interlayer insulting film 27. Further, a metal layer is formed on the interlayer insulating film 27, by the sputtering apparatus, and is patterned, forming the data lines 28. Next, an SiN film is formed by the plasma CVD apparatus, and is subsequently pattern, forming the protective insulating film 29.

As in the first embodiment, the gate electrode 21 is made of aluminum containing a high-melting-point metal and oxygen and/or nitrogen. More specifically, the gate electrode 21 is made of aluminum containing titanium (Ti) and oxygen and/or nitrogen, or Ti, oxygen/nitrogen-containing Al.

The content of Ti in the Ti, oxygen/nitrogen-containing Al is of such a value that the gate electrode 21 and the scan line integral therewith will have no hillocks when the insulating films 22, 27 or 29, or the semiconductor layer 24 is formed.

As indicated above, the gate insulating film 22 can be formed at a film-forming temperature of about 350° C. or at a relatively low film-forming temperature of about 250° C. The same holds true of the interlayer insulating film 27. The i-type semiconductor layer 23 and the n-type semiconductor layer 24 are formed at about 250° C., and the metal layers for forming the source and drain electrodes, the data line, and the pixel electrode are formed at about 100° C.

The highest of these temperatures is about 350° C. at which the insulating films 22, 27, and 29 are formed. These films 22, 27, and 29 can formed formed at a lower temperature of about 250° C. Thus, if the films 22, 27, and 19 are formed at about 350° C., it suffices to set the Ti content of the Ti, oxygen/nitrogen-containing Al at such a value that the gate electrode 21 and the scan line will have no hillocks when heated to about 350° C. Alternatively, if the insulating films 22, 27, and 29 are formed at about 250° C., it suffices to set the Tl content of the Ti, oxygen/nitrogen-containing Al at such a value that the gate electrode 21 and the scan line will have no hillocks when heated to about 250° C.

The layer of Ti, oxygen/nitrogen-containing Al (i.e., the layer of which to form the gate electrode) can be formed by a sputtering apparatus, using a target made of aluminum containing a proper amount of titanium and an appropriate amount of oxygen and/or nitrogen. Alternatively, the layer can be formed by means of sputtering in sputtering gas which contains oxygen and/or nitrogen. The temperature at which to form the layer of the Ti, oxygen/nitrogen-containing Al is approximately 100° C.

The gate electrode 21, i.e., the lower conductive layer, of the thin-film transistor is made of the Ti, oxygen/nitrogen-containing Al having a Ti content of about 7 wt % or about 5 wt % and an oxygen and/or nitrogen content of about 4 at % or more. Hence, the gate electrode 21 and the scan line integral with the electrode 21 will have no hillocks or projections, like the gate electrodes and the scan lines of the first embodiment, when they are heated while the gate insulating film 22, the i-type semiconductor layer 23, or the n-type semiconductor layer 24 is being formed.

In the thin-film transistor of FIG. 4, the source electrode 25 and the drain electrode 26, both formed of the upper layer, are made of metal such as chromium. Instead, these electrodes can be made of the Ti, oxygen/nitrogen-containing Al specified above. If they are made of this specific material, they will not have their surfaces roughened at all when the interlayer insulating film 27 or the protective insulating film 29 is formed. Hence, the source electrode 25 and the drain electrode 26 remain in firm bonding with the n-type semiconductor layer 24. As a result, the ohmic contact between the electrodes 25 and 26, on the one hand, and the n-type semiconductor layer 24, on the other, is secured.

The data line 28 may be made of any metal desirable. Nonetheless, they should better be made of the Ti, oxygen/nitrogen-containing Al specified above. If the data line 28 is made of this specific material, they will have neither hillocks nor projections when the protective insulating film 29 is formed on the data line 28, and no defects such as cracks will be formed in the protective insulating film 29. Even if the film 28 has defects, however, no great problems will arise. In view of this, the protective insulating film 29 can be made of aluminum or aluminum containing only Ti.

In the second embodiment (FIG. 4), Ti is used as high-melting-point metal to be contained in aluminum. Ti can be replaced by Ta or the like. Further, the aluminum may contain hydrogen as well. The gate insulating film 22 made of SiN can be replaced by a two-layer film consisting of a SiN film and an oxide film (e.g., a silicon oxide film, a tantalum oxide film, an aluminum oxide film, or the like).

The thin-film transistor shown in FIG. 4 is of reverse stagger type. Nonetheless, the present invention can be applied not only to a reverse stagger thin-film transistor, but also to a reverse coplanar thin-film transistor, a stagger thin-film transistor, a coplanar thin-film transistors, and a thin-film diode.

Electrodes made of aluminum containing high-melting-point metal such as Ti or Ta and oxygen and/or nitrogen can be formed by the following method.

Figure 5:
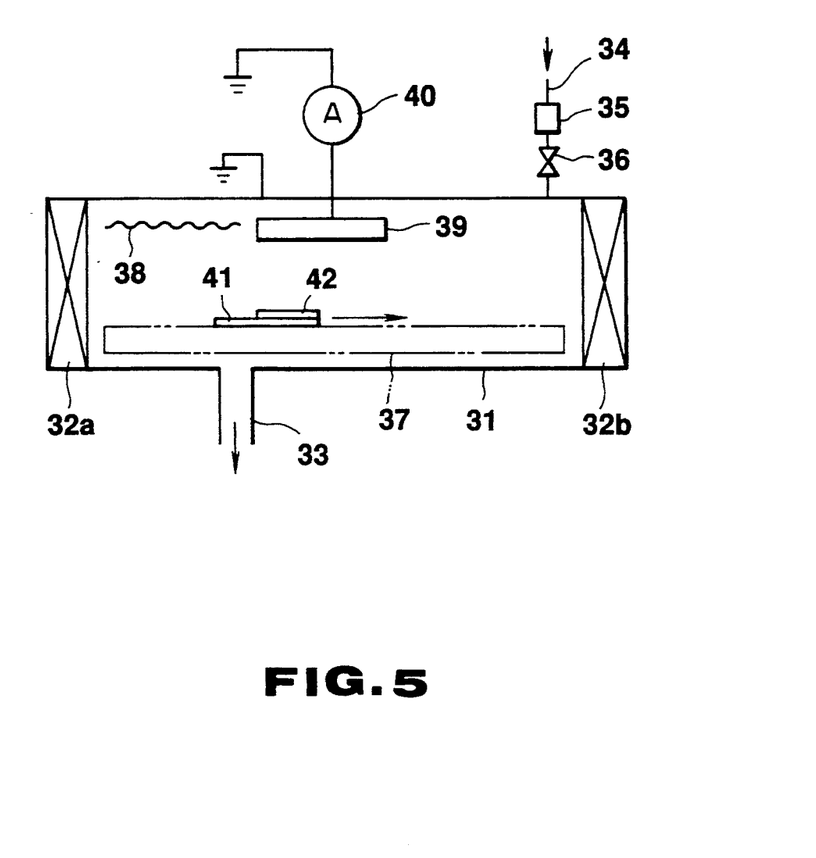
FIG. 5 is a schematic view of an apparatus for forming a conductive layer according to the present invention.

FIG. 5 shows a sputtering apparatus designed to form various metal layers. This apparatus comprises a sputtering chamber 31 having an inlet port and an outlet port through which to place a substrate within the chamber 31 and remove the same therefrom. It further comprises two airtight doors 32a and 32b for closing and opening the inlet port and the outlet port, respectively, an exhaust pipe 33 connecting the sputtering chamber 31 and a vacuum pump (not shown) located outside the chamber 31, and a sputtering gas pipe 34 connected to the chamber 31 for supplying a sputtering gas such as Ar gas into the sputtering chamber 31. A flow rate controller 35 and a valve 36 are arranged on the sputtering gas pipe 34. The sputtering chamber 31 contains a substrate-transporting mechanism 37, a heater 38, and a target 39. The mechanism 37 is mounted on the bottom of the chamber 31, for transporting a substrate from the inlet port to the outlet port. The heater 38 and the target 39 are located side by side, above the mechanism 37. The target 39 is connected to a sputtering power supply 40 which is positioned outside the chamber 31.

In this sputtering apparatus, a layer of aluminum alloy is formed on a substrate 41 in the following way, by using the target 39 which is made of the aluminum alloy containing high-melting-point metal such as Ti or Ta.

First, the airtight door 32a is opened, and the substrate 41 is inserted into the sputtering chamber 31 through the inlet port and placed on the substrate-transporting mechanism 27, with that surface turned upward on which to form an aluminum alloy layer.

Then, the airtight door 32a is closed, sealing the chamber 31 in airtight fashion. The vacuum pump (not shown) is driven, exhausting air from the chamber 31 until the pressure in the chamber 31 is reduced to $5 \times 10^{-5}$ to $5 \times 10^{-4}$ Torr. The reduced pressure is ten or more times to hundred or more times higher than the intra-chamber pressure ($5 \times 10^{-6}$ Torr or less) under which to form a layer by the conventional method. The chamber 31 is not completely void of air; a small amount of air remains in the sputtering chamber 31.

Thereafter, the heater 38 is turned on, heating the substrate 41, and the sputtering gas is introduced into the chamber 31. The substrate 41 is heated to a predetermined film-forming temperature, and the pressure of the sputtering gas is stabilized at a predetermined value ($3 \times 10^{-3}$ to $8 \times 10^{-3}$ Torr). The mechanism 37 is driven, starting to move the substrate 41. Simultaneously, a discharge current is supplied from the sputtering power supply 40 to the target 39, whereby the sputtering is initiated. As is known in the art, the sputtering proceeds as will be described below.

When the discharge current is supplied to the target 39 from the power supply 40, plasma is generated. Particles of the aluminum alloy are thereby sputtered from the target 29 onto the substrate 41, whereby a layer of the aluminum alloy is deposited on the surface of the substrate 41.

In this method, the pressure in the chamber 31 is reduced to $5 \times 10^{-5}$ to no less than $5 \times 10^{-4}$ Torr after the substrate 41 has been placed within the chamber 31, and a small amount of air therefore remains in the sputtering chamber 31. The nitrogen, oxygen and hydrogen, contained in the air, are deposited on the substrate 41, along with the particles of the aluminum alloy. As a result, the aluminum alloy layer formed on the substrate 41 contains a small amount of nitrogen, oxygen and hydrogen.

Containing nitrogen, oxygen and hydrogen, the aluminum alloy layer formed by the method of the invention will have neither hillocks nor projections extending from its sides or edges as is shown in FIGS. 6 and 7, even if it is heated to hundreds of degrees centigrade.

As it has been described, in the thin-film device according to the invention which has a multi-layer structure specified above, the lower conductive layer is made of aluminum alloy, formed by the method descried above, and has neither hillocks nor projections which might otherwise be formed due to abnormal crystal growth.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A thin-film transistor comprising:
   an insulating substrate;
   a gate electrode formed on the insulating substrate and made of aluminum alloy containing a high-melting-point metal and 4 at % or more of oxygen or nitrogen or both;
   a gate insulating film formed on said gate electrode;
   an i-type semiconductor layer formed on said gate insulating film; and
   a source electrode and a drain electrode electrically connected to two ends of said i-type semiconductor layer, respectively.

2. The thin-film transistor according to claim 1, wherein said gate electrode is made of aluminum alloy containing titanium and oxygen.

3. The thin-film transistor according to claim 1, wherein said gate electrode is made of aluminum alloy containing titanium and nitrogen.

4. The thin-film transistor according to claim 1, wherein said gate electrode is made of aluminum alloy containing tantalum and oxygen.

5. The thin-film transistor according to claim 1, wherein said aluminum alloy contains at least one selected from the group consisting of titanium and tantalum, and about 4 at % or more of nitrogen or oxygen.

6. The thin-film transistor according to claim 1, wherein said high-melting-point metal consists of at least one selected from the group consisting of titanium and tantalum.

7. The thin-film transistor according to claim 1, wherein said source electrode and said drain electrode are made of aluminum alloy substantially identical to the aluminum alloy forming said gate electrode.

8. A thin-film transistor panel comprising:
   an insulating substrate;
   a plurality of transparent pixel electrodes arranged in rows and columns on said insulating substrate;
   a plurality of thin-film transistors each located at one of said pixel electrodes, respectively, each having a gate electrode, an gate insulating film formed on the gate electrode, an i-type semiconductor layer formed on the gate insulating film, and a source electrode and a drain electrode electrically connected to two ends of the i-type semiconductor layer, respectively, and each having one of the source and drain electrodes connected to the associated pixel electrode;
   a plurality of scan lines expending parallel to one another, each connecting the gate electrodes of the thin film transistors of the same row and made of aluminum alloy containing a high-melting-point metal and 4 at % or more of oxygen or nitrogen or both; and
   a plurality of data lines expending parallel to one another, each connecting the source electrodes or drain electrodes of the thin-film transistors of the same column, which are other than those connected to the pixel electrodes.

9. The thin-film transistor panel according to claim 8, wherein said high-melting-point metal consists of at least one selected from the group consisting of titanium and tantalum.

10. The thin-film transistor panel according to claim 8, wherein the gate electrode of each of said thin-film transistors is integral with an associated one of said scan lines and is made of aluminum alloy substantially identical to the aluminum alloy forming said scan line.

11. The thin-film transistor panel according to claim 8, wherein said data lines are made of aluminum alloy containing at least one selected from the group consisting of titanium and tantalum, and about 4 at % or more of nitrogen or oxygen.

12. The thin-film transistor panel according to claim 8, wherein the gate electrode of each of said thin-film transistors is integral with an associated one of said scan lines and is made of aluminum alloy substantially identical to the aluminum alloy forming said scan line, the source electrode and the drain electrode of each of said thin-film transistors are made of the same aluminum alloy as the gate electrode, and said data lines are made of the same aluminum alloy as the gate electrode.

13. A thin-film transistor assembly comprising:
an insulating substrate; and
a thin-film transistor, formed on the insulating substrate, the thin-film transistor including:
a semiconductor layer having opposite ends;
an insulating film;
a source electrode and a drain electrode electrically connected to the opposite ends of said semiconductor layer; and
a gate electrode formed on the insulating film to face the semiconductor layer,
at least one of said electrodes contacting the insulating substrate and being made of aluminum alloy containing a high-melting-point metal, and about 4 at % or more of oxygen, nitrogen, or both.

14. The thin-film transistor according to claim 13, wherein said aluminum alloy contains titanium and oxygen.

15. The thin-film transistor according to claim 13, wherein said aluminum alloy contains titanium and nitrogen.

16. The thin-film transistor according to claim 13, wherein said aluminum alloy contains tantalum and oxygen.

17. The thin-film transistor according to claim 13, wherein said alloy contains at least one selected from the group consisting of titanium and tantalum, and about 4 at % or more of nitrogen or oxygen.

18. An active matrix panel comprising:
an insulating substrate;
a plurality of transparent electrodes arranged in rows and columns on said insulating substrate;
a plurality of thin-film active elements arranged in rows and columns and each located at one of said transparent electrodes respectively, each having a first electrode connected to said transparent electrode, and a second electrode for supplying voltage via said first electrode to said transparent electrode, at least one of said electrodes contacting the insulating substrate and being made of aluminum alloy containing a high-melting-point metal and about 4 at % or more of oxygen, nitrogen, or both; and
a plurality of voltage supplying lines arranged on said insulating substrate along at least one of the rows and columns, said voltage supplying lines being connected to said thin-film active elements to supply voltage to said second electrode.

19. The thin-film transistor according to claim 13, wherein said high-melting-point metal consists of at least one selected from the group consisting of titanium and tantalum.

* * * * *